(12) United States Patent
Jun et al.

(10) Patent No.: US 10,439,057 B2
(45) Date of Patent: Oct. 8, 2019

(54) MULTI-GATE HIGH ELECTRON MOBILITY TRANSISTORS AND METHODS OF FABRICATION

(71) Applicant: INTEL CORPORATION, Santa Clara, CA (US)

(72) Inventors: Kimin Jun, Hillsboro, OR (US); Sansaptak Dasgupta, Hillsboro, OR (US); Alejandro X. Levander, Santa Clara, CA (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/329,216

(22) PCT Filed: Sep. 9, 2014

(86) PCT No.: PCT/US2014/054823
§ 371 (c)(1),
(2) Date: Jan. 25, 2017

(87) PCT Pub. No.: WO2016/039733
PCT Pub. Date: Mar. 17, 2016

(65) Prior Publication Data
US 2017/0229565 A1    Aug. 10, 2017

(51) Int. Cl.
*H01L 29/778* (2006.01)
*H01L 29/423* (2006.01)
(Continued)

(52) U.S. Cl.
CPC ...... *H01L 29/7781* (2013.01); *H01L 29/2003* (2013.01); *H01L 29/42356* (2013.01);
(Continued)

(58) Field of Classification Search
CPC .......... H01L 29/42356; H01L 29/7781; H01L 21/76254; H01L 29/66545
See application file for complete search history.

(56) References Cited

U.S. PATENT DOCUMENTS

| 2004/0157396 A1 | 8/2004 | Lee et al. |
| 2009/0117707 A1 | 5/2009 | Shimomura et al. |

(Continued)

FOREIGN PATENT DOCUMENTS

| JP | 2008-252470 A | 9/2000 |
| JP | 2014-508396 | 4/2014 |
| KR | 10-2007-0061841 | 6/2007 |

OTHER PUBLICATIONS

European Communication pursuant to Rules 161(2) and 162 EPC for European Application No. 14 90 1471.4, dated Apr. 20, 2017, 2 pages.

(Continued)

*Primary Examiner* — Matthew C Landau
*Assistant Examiner* — Mark Hatzilambrou
(74) *Attorney, Agent, or Firm* — Schwabe, Williamson & Wyatt P.C.

(57) ABSTRACT

A multi-gate high electron mobility transistor (HEMT) and its methods of formation are disclosed. The multi-gate HEMT includes a substrate and an adhesion layer on top of the substrate. A channel layer is disposed on top of the adhesion layer, and a first gate electrode is disposed on top of the channel layer. The first gate electrode has a first gate dielectric layer in between the first gate electrode and the channel layer. A second gate electrode is embedded within the substrate and beneath the channel layer. The second gate electrode has a second gate dielectric layer completely surrounding the second gate electrode. A pair of source and drain contacts are disposed on opposite sides of the first gate electrode.

15 Claims, 8 Drawing Sheets

(51) Int. Cl.
*H01L 29/20* (2006.01)
*H01L 29/66* (2006.01)
*H01L 21/762* (2006.01)

(52) U.S. Cl.
CPC .. *H01L 29/42376* (2013.01); *H01L 29/66462* (2013.01); *H01L 21/76254* (2013.01); *H01L 29/66545* (2013.01)

(56) References Cited

U.S. PATENT DOCUMENTS

| | | |
|---|---|---|
| 2010/0140589 A1 | 6/2010 | Ionescu |
| 2011/0147708 A1* | 6/2011 | Radosavljevic ....... B82Y 10/00 257/24 |
| 2011/0171792 A1 | 7/2011 | Chang et al. |
| 2012/0115296 A1 | 5/2012 | Vandenderghe et al. |
| 2013/0119397 A1* | 5/2013 | Eum ................... H01L 29/2003 257/76 |
| 2013/0161698 A1 | 6/2013 | Marino et al. |
| 2013/0216941 A1* | 8/2013 | Ogadhoh ................. G03F 1/26 430/5 |

OTHER PUBLICATIONS

International Searching Authority At the Korean Intellectual Property Office, International Search Report and Written Opinion for International Patent Application No. PCT/US2014/054823, dated May 28, 2015, 10 pages.
Vetury, Polarization Induced 2DEG in AlGaN/GaN HEMTs: On the origin, DC and transient characterization, 2000, 60 pages, University of California, Santa Barbara.
PCT International Preliminary Report on Patentability and Written Opinion for PCT/US2014/054823, dated Mar. 23, 2017, 9 pages.
Notice of Allowance for Japanese Patent Application No. 2017-505076 dated Sep. 4, 2018, 2 pgs.
Office Action for Taiwan Patent Application No. 104125225 dated Oct. 5, 2018, 17 pgs.
Search Report from European Patent Application No. 14901471.4, dated Apr. 19, 2018, 9 pages.
Office Action from Japanese Patent Application No. 2017-505076, dated May 8, 2018, 4 pages.
Office Action from Malaysian Patent Application No. PI2017700394, dated Mar. 16, 2017, 3 pages.

* cited by examiner

FIG. 2G-1  FIG. 2G-2

MULTI-GATE HIGH ELECTRON MOBILITY TRANSISTORS AND METHODS OF FABRICATION

CROSS-REFERENCE TO RELATED APPLICATION

This patent application is a U.S. National Phase Application under 35 U.S.C, § 371 of International Application No. PCT/US2014/054823, filed Sep. 9, 2014, entitled MULTI-GATE HIGH ELECTRON MOBILITY TRANSISTORS AND METHODS OF FABRICATION.

TECHNICAL FIELD

Embodiments of the present invention relate generally to semiconductor transistors and their methods of fabrication. More particularly, embodiments of the present invention relate to multi-gate high electron mobility transistors (HEMT) and their methods of fabrication.

BACKGROUND

Compound nitride semiconductors, such as III-V semiconductors, are gaining popularity as promising alternatives or complements beyond silicon due to their large band gap electrical properties. Using large band gap materials in semiconductor technology yields semiconductor devices with high breakdown voltages and high electron mobility. Conventional devices utilizing wide band gap semiconductors are formed with a planar semiconductor structure including a single gate electrode and a pair of source and drain regions. In order to fabricate conventional planar wide band gap transistors, thick buffer layers of III-V semiconductor material are initially formed on a bulk substrate to minimize threading dislocation defects. Practically speaking, growing thick buffer layers can be costly and time consuming, thereby limiting flexibility in the design process.

BRIEF DESCRIPTION OF THE DRAWINGS

FIGS. 2A-2J illustrate cross-sectional views of a method of forming an enhancement mode multi-gate HEMT, in accordance with an embodiment of the invention.

DETAILED DESCRIPTION

Multi-gate HEMTs and their methods of fabrication are disclosed. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention are directed to multi-gate HEMTs and their methods of fabrication. In an embodiment, a multi-gate HEMT includes a channel layer disposed on top of a substrate. A first gate electrode is disposed above the channel layer and a second gate electrode is disposed beneath the channel layer. On opposite sides of the first and second gate electrodes are source and drain contacts. In embodiments, the first and second gate electrodes control current flow from above and below the channel layer, respectively. Therefore, the multi-gate HEMT has maximum control of the current flow.

Figure 1A:
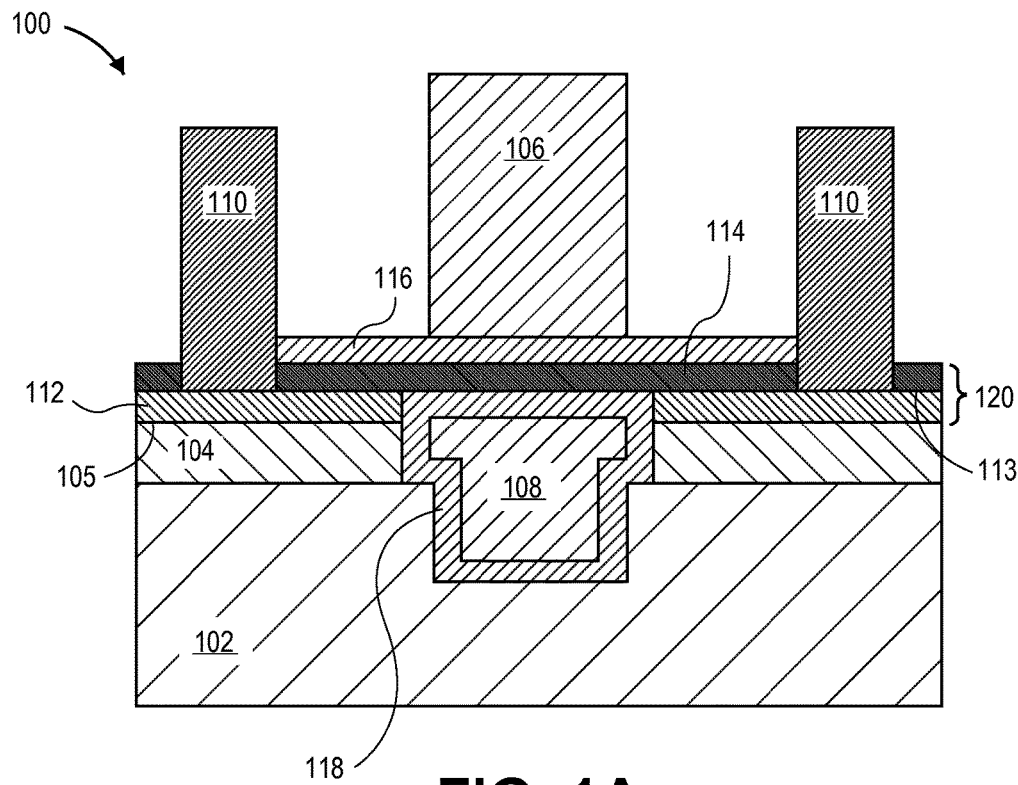
FIGS. 1A-1B illustrate cross-sectional views of multi-gate HEMTs, in accordance with an embodiment of the invention.

FIG. 1A illustrates a cross-sectional view of a multi-gate HEMT 100, in accordance with an embodiment of the invention. In an embodiment, the multi-gate HEMT 100 is formed on a carrier substrate 102. The carrier substrate 102 may be formed of any suitable substrate for semiconductor fabrication, such as a bulk monocrystalline silicon substrate. An adhesion layer 104 is formed on top of the carrier substrate 102. The adhesion layer 104 may be used to attach the carrier substrate 102 to another substrate as will be discussed below. Any suitable adhesive material, such as silicon dioxide ($SiO_2$) or aluminum oxide ($Al_2O_3$), may be used to form the adhesion layer 104.

As shown in FIG. 1A, a channel layer 120 is disposed on the adhesion layer 104. In an embodiment, the channel layer 120 is a heterogeneous structure that includes a polar semiconductor layer 114 and a polarization layer 112. In embodiments, the polar semiconductor layer 114 is disposed directly on top of the polarization layer 112. The polar semiconductor layer 114 may be formed of a wide band gap +c polar semiconductor material, such as, but not limited to, gallium nitride (GaN) or indium gallium nitride (InGaN). In embodiments, the polarization layer 112 is formed of any suitable material that induces a two dimensional electron gas (2DEG) when disposed directly adjacent to the polar semiconductor layer 114. For instance, the polarization layer 112 may be formed of aluminum gallium nitride (AlGaN), aluminum indium nitride (AlInN), or aluminum nitride (AlN).

In an embodiment of the invention, the multi-gate HEMT 100 has two gate electrodes: a first gate electrode 106 and a second gate electrode 108. The first gate electrode 106 may be disposed above the channel layer 120 and the second gate electrode 108 may be disposed beneath the channel layer 120. In an embodiment, the second gate electrode is disposed beneath the polar semiconductor layer 114. In an embodiment, the second gate electrode 108 is further disposed beneath the polarization layer 112. As shown in FIG. 1A, the second gate electrode 108 may be vertically aligned with the first gate electrode 106. Having two gate electrodes allows a gate voltage to be applied to the top and bottom surfaces of the polar semiconductor layer 114. As such, the multi-gate HEMT 100 has maximum control of the current that flows through the polar semiconductor layer 114. The first and second gate electrodes 106 and 108 may be formed of a conductive material typically used for gate electrodes. In an embodiment, the conductive material is a metal. In a particular embodiment, the conductive material is formed of nickel (Ni), titanium nitride (TiN), platinum (Pt), or tungsten (W).

The multi-gate HEMT 100 also includes two gate dielectric layers. A first gate dielectric layer 116 may be disposed between the polar semiconductor layer 114 and the first gate electrode 106. A second gate dielectric layer 118 may be disposed around a circumference of the second gate electrode 108. In an embodiment, the second gate dielectric layer 118 completely encloses the second gate electrode 108. The first and second gate dielectric layers 116 and 118 may be formed of an insulating material such as, but not limited to, silicon oxide, silicon dioxide ($SiO_2$) and/or a high-k dielectric material.

The multi-gate HEMT includes source and drain contacts formed on opposite sides of the first and second gate electrodes 106 and 108. In embodiments, source and drain contacts 110 are disposed over the carrier substrate 102 and on top of the channel layer 120. The source and drain contacts 110 are positioned to be electrically coupled to the channel layer 120. In an embodiment, the source and drain contacts 110 are disposed directly on top of the polarization layer 112. Any suitable conductive material may be used to form the source and drain contacts 110. In embodiments, the source and drain contacts 110 are epitaxial semiconductor structures formed of n-doped GaN, InGaN, or indium nitride (InN).

In the embodiment depicted in FIG. 1A, the multi-gate HEMT 100 is an enhancement mode multi-gate HEMT. The enhancement mode multi-gate HEMT 100 has the polar semiconductor layer 114 disposed between the first and second gate electrodes 106 and 108. In this embodiment, the polarization layer 112 is not disposed between the first and second gate electrodes 106 and 108. Absence of the polarization layer 112 between the first and second gate electrodes 106 and 108 prevents formation of a 2DEG between the first and second gate electrodes 106 and 108. As such, the enhancement mode multi-gate HEMT 100 does not have a 2DEG between the first and second gate electrodes 106 and 108. In this embodiment, the polar semiconductor layer 114 is effectively the channel layer 120. The polar semiconductor layer 114 may be formed of a wide band gap semiconductor material, such as GaN or InGaN.

To operate the enhancement mode multi-gate HEMT 100, a gate bias is applied to the first and second gate electrodes 106 and 108 to induce an accumulation of electrons within the polar semiconductor layer 114. The accumulation of electrons forms an inversion layer within the polar semiconductor layer 114. The inversion layer allows current to flow through the polar semiconductor layer 114 between the source and drain contacts 110. Accordingly, applying the gate bias turns ON the enhancement mode multi-gate HEMT 100. However, if no gate bias is applied, the enhancement mode multi-gate HEMT 100 does not induce an inversion layer within the polar semiconductor layer 114. Without an inversion layer, no current flows through the polar semiconductor layer 114 and the enhancement mode multi-gate HEMT 100 is therefore OFF. According to embodiments of the invention, applying the gate bias to the first and second gate electrodes 106 and 108 controls the channel layer 120 from above and below the polar semiconductor layer 114. Therefore, the enhancement mode multi-gate HEMT 100 has maximum control of the current that flows through the polar semiconductor layer 114.

Figure 1B:
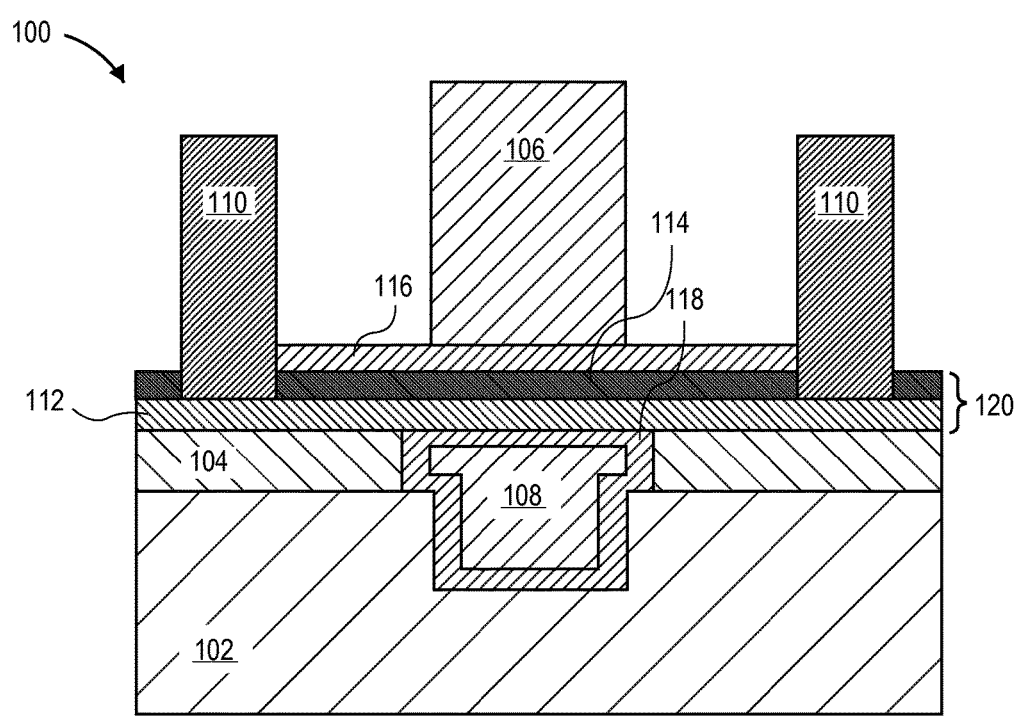

In an alternative embodiment, as depicted in FIG. 1B, a depletion mode multi-gate HEMT is illustrated. The depletion mode multi-gate HEMT 100 has both the polar semiconductor layer 114 and the polarization layer 112 disposed between the first and second gate electrodes 106 and 108. Interactions between the polar semiconductor layer 114 and the polarization layer 112 create a two-dimensional electron gas (2DEG) at an interface between the polar semiconductor layer 114 and the polarization layer 112. In embodiments, the mere presence of the polarization layer 112 forms the 2DEG at the interface. In an embodiment, the 2DEG is induced at a distance of 1-2 nm away from the interface and within the polar semiconductor layer 114. In an embodiment, the polar semiconductor layer 114 is formed of a wide band gap +c polar semiconductor material. In a particular embodiment, the polar semiconductor layer 114 is formed of GaN or InGaN. The polarization layer 112 may be formed of any suitable material that induces a 2DEG when disposed directly adjacent to the polar semiconductor layer 114. For instance, the polarization layer 112 may be formed of AlGaN, AlInN, or AlN. In a particular embodiment, the polarization layer 112 is formed of AlGaN and the polar semiconductor layer 114 is formed of GaN.

To operate the depletion mode multi-gate HEMT 101, a gate bias is not applied to the first and second gate electrodes 106 and 108. The naturally forming 2DEG allows current to freely travel between the source and drain contacts 110. Accordingly, the depletion mode multi-gate HEMT 101 is constantly ON when no gate bias is applied to the first and second gate electrodes 106 and 108. When a gate bias is applied, electrons are prevented from entering the channel layer 120 between the first and second gate electrodes 106 and 108. Without electrons in the channel layer, the channel is pinched off and no current can flow through the channel layer. Accordingly, applying a gate bias turns OFF the enhancement mode multi-gate HEMT 100. According to embodiments of the invention, applying the gate bias to the first and second gate electrodes 106 and 108 controls the channel layer 120 from above and below the polar semiconductor layer 114. As such, the depletion mode multi-gate HEMT 101 has maximum control of the current that flows through the channel layer 120.

FIGS. 2A-2M illustrate an exemplary method of forming the multi-gate HEMT according to embodiments of the invention. More specifically, FIGS. 2A-2J illustrate cross-sectional views of a method of forming an enhancement mode multi-gate HEMT, in accordance with an embodiment of the invention. FIGS. 2K-2M illustrate cross-sectional views of a method of forming a depletion mode multi-gate HEMT as continued from FIG. 2G-1, in accordance with an embodiment of the invention.

Figure 2A:
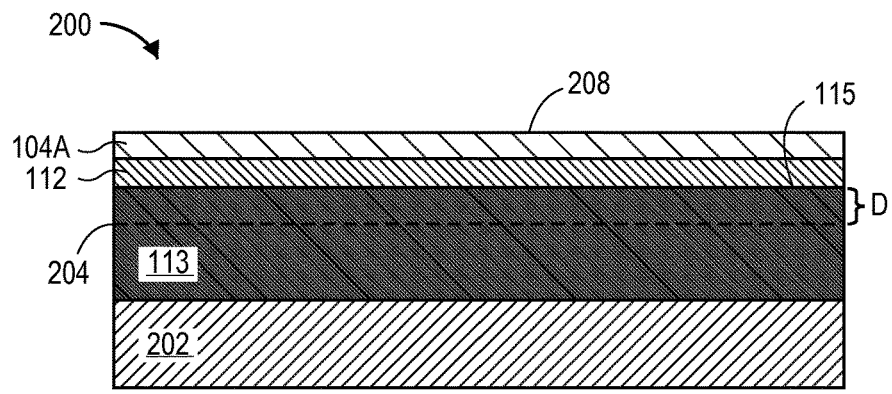

With reference to FIG. 2A, a donor substrate 200 having a donor top surface 208 is provided. In an embodiment, the donor substrate 200 includes a thick polar semiconductor layer 113 disposed on top of a template substrate 202. The donor substrate 200 further includes a first adhesion layer 104A disposed on a polarization layer 112. In embodiments, the polarization layer 112 is disposed on the thick polar semiconductor layer 113.

An exemplary process flow to form the donor substrate 200 may begin by providing the template substrate 202. The template substrate 202 provides a base upon which other layers may form. Any suitable substrate may form the template substrate 202, such as, but not limited to, a bulk monocrystalline silicon substrate or a sapphire substrate.

Next, the thick polar semiconductor layer 113 is formed on top of the template substrate 202. Any suitable growth process, such as atomic layer deposition (ALD), chemical vapor deposition (CVD), and molecular beam epitaxy (MBE), may be used to form the thick polar semiconductor layer 113. The thick polar semiconductor layer 113 may have a thickness sufficient to minimize defects created during its fabrication. For instance, a thick polar semiconductor layer 113 formed of GaN may form threading dislocation defects when grown on a non-native substrate. The defects propagate vertically and may eventually terminate after a certain height. Therefore, the thickness of the polar semiconductor layer 113 may need to be sufficient enough to form a high quality material having low defect density in an upper region of the thick polar semiconductor layer 113. The high quality material in the upper region of the thick polar semiconductor layer 113 may be later used as part of a channel layer 120, as will be discussed below. In an embodiment, the thickness of the thick polar semiconductor layer 113 is at least 20 μm. In a particular embodiment, the thickness is around 30 μm.

Next, the polarization layer 112 is formed on top of the thick polar semiconductor layer 113 by any suitable growth technique, such as epitaxial growth. The polarization layer 112 may be formed to a thickness sufficient to induce a 2DEG at the interface between the polarization layer 112 and the thick polar semiconductor layer 113. For instance, the thickness of the polarization layer 112 may range from 10 to 30 nm. In a particular embodiment, the thickness is about 20 nm. The polarization layer 112 may be formed of any suitable material having an intrinsic charge polarity that interacts with the thick polar semiconductor layer 113 to induce a 2DEG at the interface between the polarization layer 112 and the thick polar semiconductor layer 113. Exemplary materials for the polarization layer 112 include AlGaN, AlInN, and AlN.

The first adhesion layer 104A is then formed on top of the polarization layer 112, thereby completing formation of the donor substrate 200. Any suitable deposition process may be used to form the first adhesion layer 104A, such as chemical vapor deposition (CVD) and physical vapor deposition (PVD). The first adhesion layer 104A attaches the donor substrate 200 to a separate substrate, such as the receiver substrate 201 illustrated in FIG. 2B-1. The first adhesion layer 104A may be designed to have a thickness sufficient to form a strong bond when fused with another adhesion layer, such as a second adhesion layer 104B illustrated in FIG. 2B-1. In embodiments, the thickness of the first adhesion layer 104A ranges from 10-20 nm. The first adhesion layer 104A may be formed of any suitable material with adhesive properties, such as $SiO_2$ or $Al_2O_3$. In a particular embodiment, the donor substrate 200 includes a template substrate 202 formed of silicon, a thick polar semiconductor layer 113 formed of GaN, a polarization layer 112 formed of AlGaN, and a first adhesion layer 104A formed of $SiO_2$.

An optional perforation layer 204 may be formed within the thick polar semiconductor layer 113 in preparation for an ion cleaving process. In an embodiment, the perforation layer 204 is implanted anytime after growing the thick polar semiconductor layer 113. In an embodiment, the perforation layer 204 is implanted after depositing the first adhesion layer 104A. In an embodiment, the perforation layer 204 is created by hydrogen implantation to a depth D from the top surface 115 of the thick polar semiconductor layer 113. The perforation layer 204 may determine the point at which the donor substrate 200 will be cut by the ion cleaving process. In embodiments, the depth D of the hydrogen implantation is a target thickness of a polar semiconductor layer 114 to be formed as part of the channel layer 120 as shown in FIG. 1A.

A portion of the thick polar semiconductor layer 113 disposed above the depth D may be high-quality semiconductor material later used as part of the channel layer 120. In an embodiment, the depth D is at least 2 nm. In a particular embodiment, the depth D is in the range of 20 to 100 nm.

Figures 1, 2B:
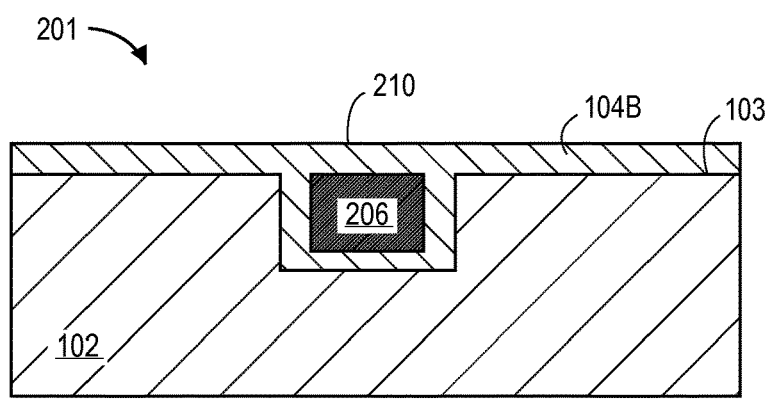
Figures 2, 2B:
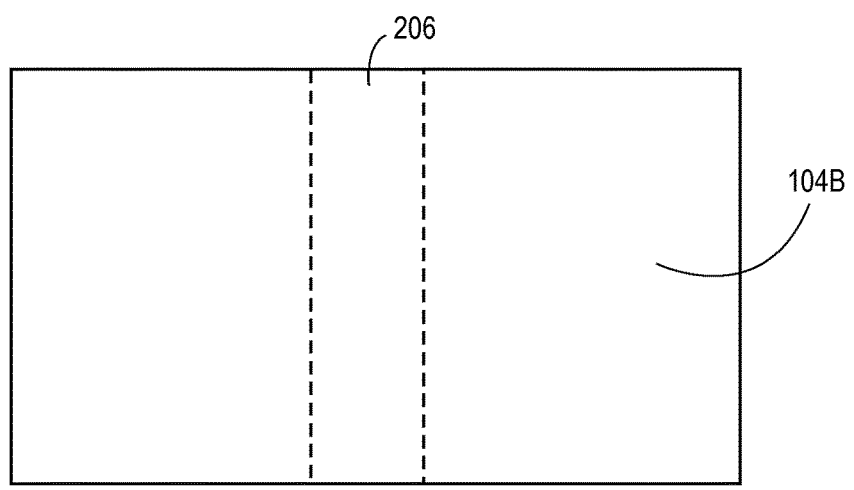

Next, in FIG. 2B-1, a receiver substrate 201 having a receiver top surface 210 is provided. In an embodiment, the receiver substrate 201 includes a carrier substrate 102 formed of any suitable substrate for semiconductor fabrication, such as a bulk monocrystalline silicon substrate.

A sacrificial layer 206 is formed within the receiver substrate 201. The sacrificial layer 206 may be completely embedded within the receiver substrate 201. As shown in a top-view perspective of the receiver substrate 201 in FIG. 2B-2, the sacrificial layer 206 may extend down a portion of the carrier substrate 102 within a second adhesion layer 104B. With reference back to the embodiment depicted in FIG. 2B-1, the sacrificial layer 206 is formed within a trench of the carrier substrate 102 and completely surrounded by the second adhesion layer 104B. The second adhesion layer 104B may immediately surround the sacrificial layer 206 within the trench of the carrier substrate 102. In embodiments, the sacrificial layer 206 is formed from a sacrificial material that can be selectively removed relative to the adhesion layer 104B. Further, the sacrificial layer 206 is formed of a sacrificial material that does not diffuse into the adhesion layer 104B. The sacrificial layer 206 may also withstand subsequent processing conditions used to form other features of the multi-gate HEMT. In an embodiment, the sacrificial layer 206 may be formed from a metal, such as tungsten, or a nitride, such as titanium nitride (TiN) or silicon nitride (SiN).

As illustrated in FIG. 2B-1, a portion of the second adhesion layer 104B is disposed on top of the carrier substrate 102. The second adhesion layer 104B may attach the receiver substrate 201 to a separate substrate, such as the donor substrate 200. In an embodiment, the second adhesion layer 104B has a thickness sufficient to form a strong bond when fused with another adhesion layer, such as the first adhesion layer 104A in FIG. 2A. In embodiments, the thickness of the second adhesion layer 104B ranges from 15-20 nm. Any suitable material with adhesive properties may form the second adhesion layer 104B. For example, the second adhesion layer 104B may be formed of $SiO_2$ or $Al_2O_3$.

The receiver substrate 201 may be formed by well-known deposition and etch processes. An exemplary process flow to form the receiver substrate 201 may begin by initially etching a trench within the carrier substrate 102 with an anisotropic etch process. Thereafter, an initial adhesion layer may be deposited within the trench and on a top surface 103 of the carrier substrate 102. Next, the sacrificial layer 206 is formed on the initial adhesion layer and within the trench. A planarization process may then remove portions of the sacrificial layer 206 and a portion of the initial adhesion layer disposed above the top surface 103 of the carrier substrate 102. Finally, a subsequent adhesion layer may be deposited on the top surface 103 of the carrier substrate 102, on top of the initial adhesion layer, and on top of the sacrificial layer 206. A remaining portion of the initial adhesion layer together with the subsequent adhesion layer form the second adhesion layer 104B as illustrated in FIG. 2B-1.

Figure 2C:
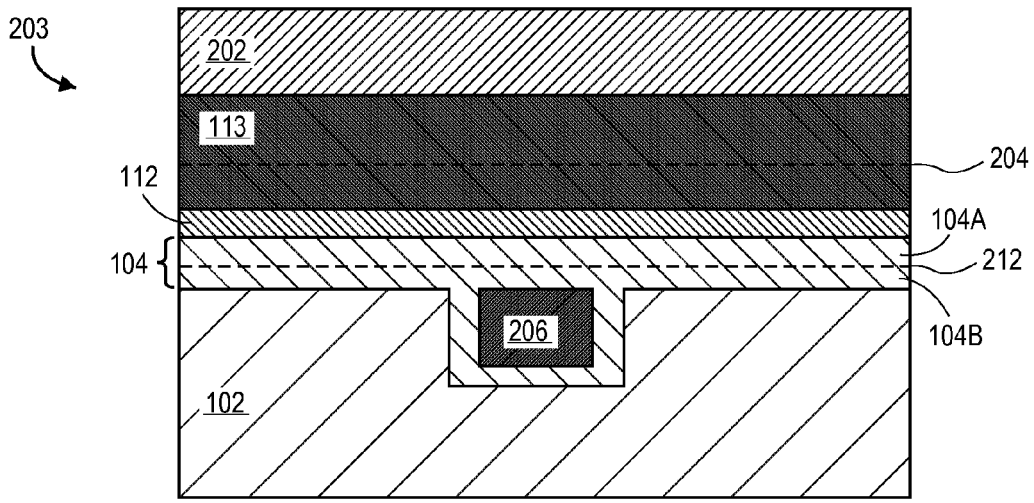

After the donor substrate 200 and the receiver substrate 201 are provided, the donor substrate 200 is then attached to the receiver substrate 201 to form a bonded substrate 203 as illustrated in FIG. 2C. In an embodiment, attaching the donor substrate 200 to the receiver substrate 201 is performed by bonding the first adhesion layer 104A to the second adhesion layer 104B. Bonding of the first adhesion layer 104A to the second adhesion layer 104B may occur by a direct wafer bonding process. In an embodiment, the direct wafer bonding process forms a chemical bond between the top surfaces of the two adhesion layers 104A and 104B. The direct wafer bonding process may be an oxide fusion bonding process. The oxide fusion bonding process may include temporarily holding the top surfaces of the two adhesion layers 104A and 104B in place with electrostatic forces, such as van der Waals forces. A thermal anneal may then chemically bond the two layers together.

In embodiments, the adhesion layers 104A and 104B are fused together to form the bonded adhesion layer 104. The bonded adhesion layer 104 may have a thickness determined by the sum of the first and second adhesion layers 104A and 104B. The thickness of the bonded adhesion layer 104 should not be too thick for a via to be formed through it. Further, the thickness of the bonded adhesion layer 104 should be thick enough to form a bond sufficient to withstand wafer handling and subsequent semiconductor processing. In an embodiment, the thickness of the bonded adhesion layer 104 ranges from 30 to 40 nm.

Figure 2D:
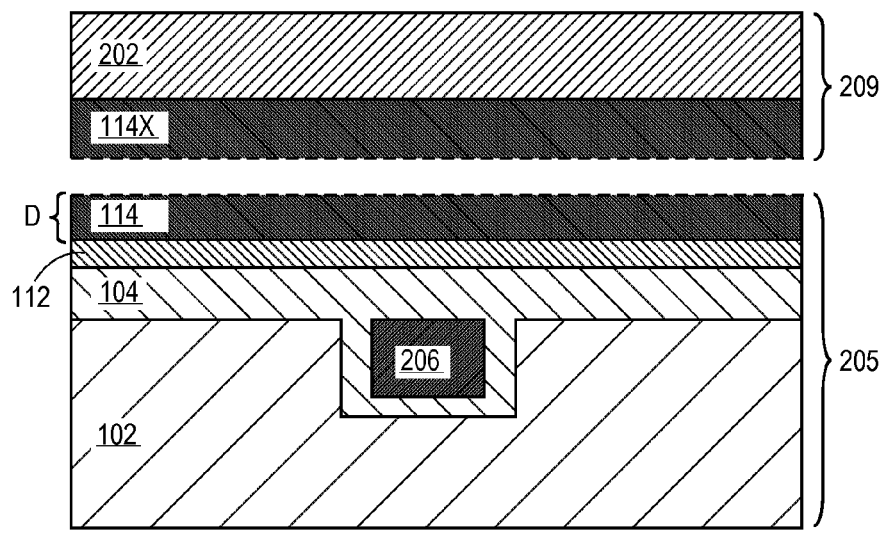

Next, as shown in FIG. 2D, the bonded substrate 203 is separated at a point within the thick polar semiconductor layer 113 to remove a portion 209 of the bonded substrate 203. A remaining portion of the bonded substrate 203 forms a device substrate 205. The device substrate 205 will be used to form the multi-gate HEMT according to embodiments of the invention. The thick polar semiconductor layer 113 is separated into a portion 114$x$ and a polar semiconductor layer 114. The portion 114$x$ may be discarded or reused for subsequent surface donations with the portion 209. The polar semiconductor layer 114 may remain as part of the device substrate 205 for fabrication of the multi-gate HEMT. In embodiments, the polar semiconductor layer 114 is disposed in a top portion of the device substrate 205 where a channel layer 120 is disposed. The polar semiconductor layer 114 may be formed of the high quality material in the upper region of the thick polar semiconductor layer 113 discussed above with respect to FIG. 2A.

In embodiments, the polar semiconductor layer 114 is used to form a channel layer for the multi-gate HEMT according to embodiments of the invention. The polar semiconductor layer 114 may have a thickness sufficient for current flow during operation of the multi-gate HEMT. In an embodiment, the thickness of the polar semiconductor layer 114 is equivalent to the depth D of the implanted hydrogen atoms discussed in FIG. 2A. In one embodiment, the thickness of the polar semiconductor layer 114 is at least 2 nm. In a specific embodiment, the thickness of the polar semiconductor layer 114 is in the range of 20 to 100 nm.

In an embodiment, the bonded substrate 203 is separated by ion cutting at the perforation layer 204 within the thick polar semiconductor layer 113 where hydrogen atoms were implanted as discussed in FIG. 2A. Ion cutting may be performed by an initial thermal anneal that forms voids where the hydrogen atoms are implanted. Once the voids are formed, the portion 209 may be easily separated due to structural weakness caused by the voids. Alternative separation methods include any conventional cutting technique, such as spalling, or any suitable selective etch release technique. One skilled in the art would understand the processes required to implement the selective etch release technique to separate the bonded substrate 203. A polishing process, such as chemical mechanical polishing (CMP), may then be used to smooth the top surface and thin the layer 114 to desired thickness.

Figure 2E:
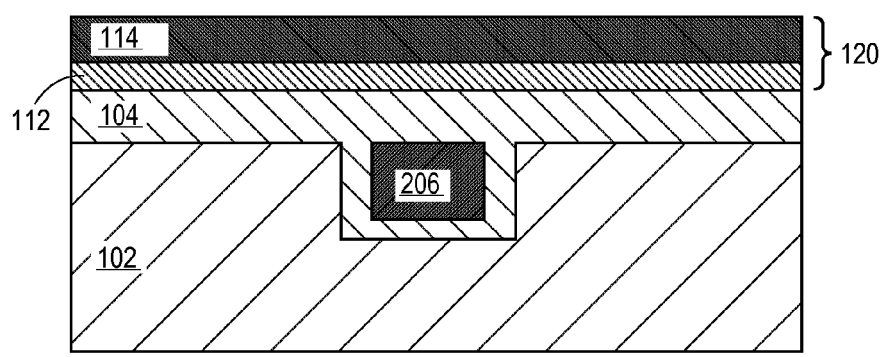

After separating and removing the portion 209 of the bonded substrate 203, the device substrate 205, as shown in FIG. 2E, is used to form the multi-gate HEMT 100 according to embodiments of the invention. In an embodiment, the device substrate 205 includes the carrier substrate 102, the sacrificial layer 206, the bonded adhesion layer 104, and the channel layer 120. In an embodiment, the channel layer 120 is a heterogeneous structure formed of the polar semiconductor layer 114 and the polarization layer 112. In embodiments, the polar semiconductor layer 114 is disposed directly on top of the polarization layer 112.

Figure 2F:
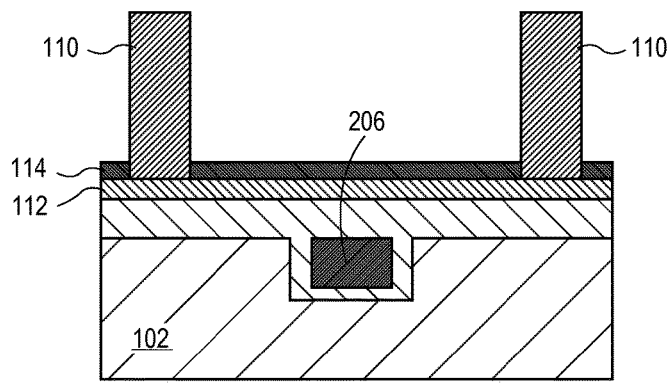

Next, as shown in FIG. 2F, source and drain contacts 110 are formed on opposite sides of the sacrificial layer 206 and over the carrier substrate 102. The source and drain contacts 110 may be formed by epitaxial growth from the polar semiconductor layer 114. For instance, the source and drain contacts 110 may be formed by ALD or CVD. In an embodiment, the source and drain contacts 110 extend through the polar semiconductor layer 114 and are formed directly on top of the polarization layer 112. As such, the source and drain contacts 110 are coupled to the polar semiconductor layer 114 and the polarization layer 112. Additionally, the source and drain contacts 110 may be coupled to the 2DEG layer formed within the polar semiconductor layer 114. The source and drain contacts 110 are formed of any suitable semiconductor material. In an embodiment, the source and drain contacts 110 are formed of n-doped GaN, InGaN, or InN.

Thereafter, as shown in FIG. 2G-1, the sacrificial layer 206 is selectively removed to form a void 210. In an embodiment, the sacrificial layer 206 is removed by a first etch process that substantially removes only the sacrificial layer 206. In an embodiment, the first etch process is an isotropic wet etch process using an etchant that selectively removes the sacrificial layer 206 relative to the surrounding bonded adhesion layer 104. That is, the etchant substantially removes the sacrificial layer 206 while leaving the surrounding bonded adhesion layer 104 substantially intact. In an embodiment, the etchant is phosphoric acid ($H_3PO_4$) or a mixture of ammonium hydroxide and hydrogen peroxide ($NH_4OH+H_2O_2$).

To remove the sacrificial layer 206, at least one or more openings 211 may be formed through a region 209 directly over the sacrificial layer 206 as shown in a top-view perspective illustrated in FIG. 2G-2. The openings 211 do not interfere with the channel layer 120. In an embodiment, the openings 211 expose the sacrificial layer 206 and provide a tunnel through which etchants may flow. The etchants may be used to selectively remove the sacrificial layer 206. In embodiments, the openings 211 may be formed by any suitable etch process, such as a plasma etch process.

Figure 2H:
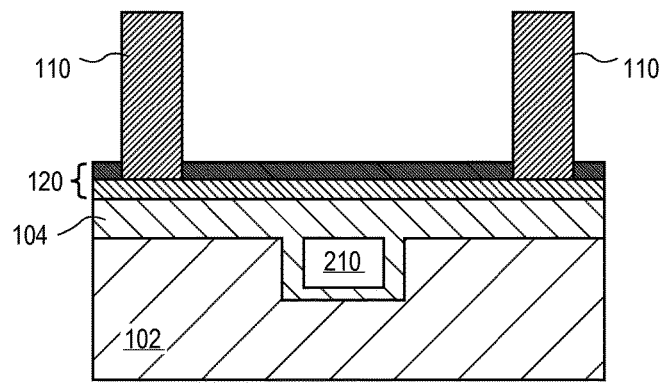
Figure 2H:
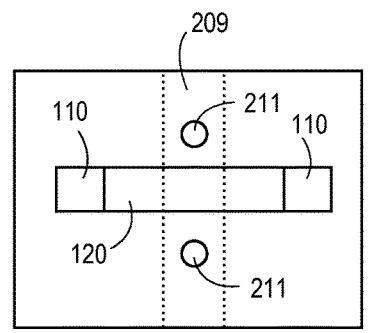
Figure 2H:
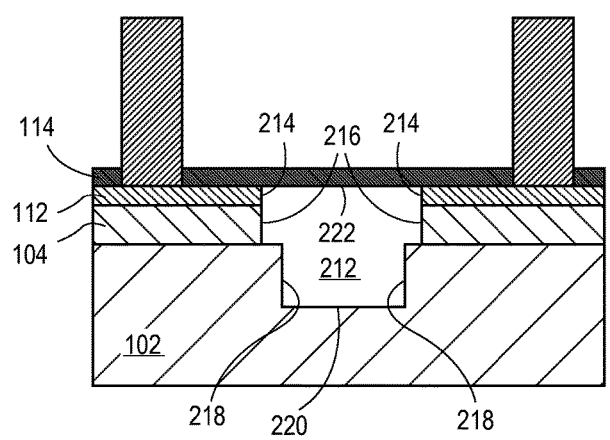

Next, the void 210 is expanded to form an enlarged void 212 as shown in FIG. 2H. In an embodiment, a portion of the polarization layer 112 is removed to form the enlarged void 212. Accordingly, the enlarged void 212 may expose a bottom surface 222 of the polar semiconductor layer 114. The enlarged void 212 may also expose other surfaces within the device substrate 205. For example, the enlarged void 212 may further expose sidewalls 214 of the polarization layer 112, sidewalls 216 of the bonded adhesion layer 104, and surfaces 218 and 220 of the carrier substrate 102. The enlarged void 212 may define the gate length of the bottom gate electrode 108 shown in FIGS. 1A-1B. In an alternative embodiment, the enlarged void 212 does not expose the polar semiconductor layer 114, as will be discussed further below in FIGS. 2K-2M.

In embodiments, the enlarged void 212 is formed by two etch processes. For example, the enlarged void 212 may be formed by a second etch process and a third etch process. In an embodiment, the second etch process substantially removes only a portion of the bonded adhesion layer 104. The second etch process may be an isotropic wet etch process that uses an etchant to selectively remove the bonded adhesion layer 104 relative to the surrounding layers (i.e., 112, and 102). That is, the etchant substantially removes the bonded adhesion layer 104 while leaving the surrounding layers substantially intact. In an embodiment, the etchant is hydrofluoric acid (HF).

In an embodiment, the third etch process removes a portion of the polarization layer 112. The third etch process may be a wet etch process that selectively removes the polarization layer 112 relative to the surrounding layers (i.e., 114, 104, and 102). That is, the etchant substantially removes the polarization layer 112 while leaving the surrounding layers 114, 104, and 102 substantially intact. In an embodiment, the etchant is potassium hydroxide (KOH), sodium hydroxide (NaOH), or AZ400K photoresist developer.

Figure 2I:
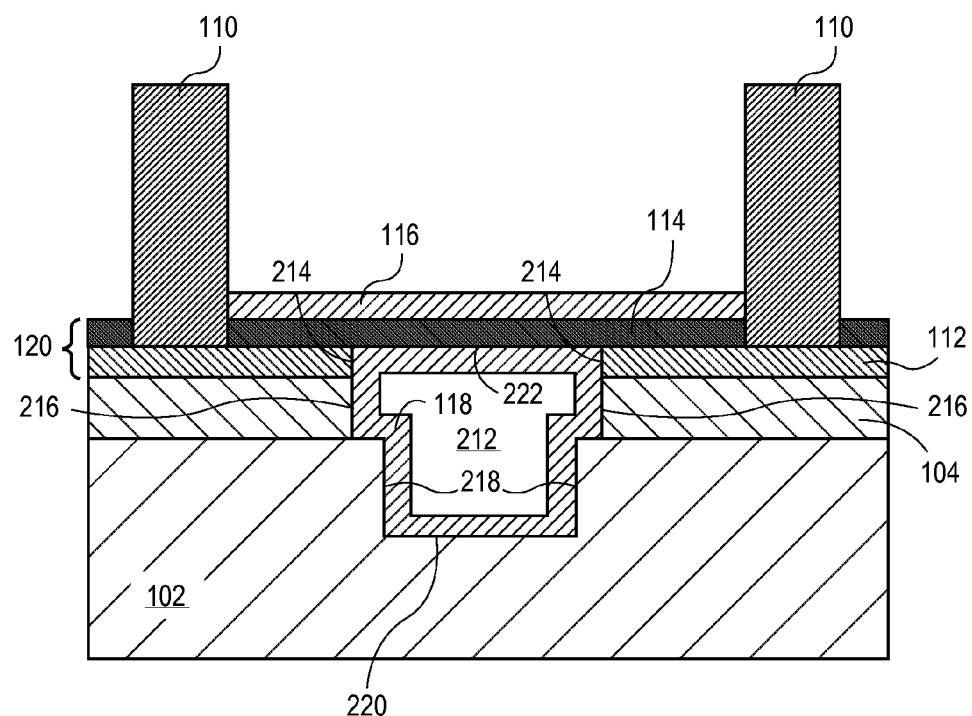

Next, as shown in FIG. 2I, a first gate dielectric layer 116 and a second gate dielectric layer 118 are formed. In embodiments, the first gate dielectric layer 116 is formed on top of the channel layer 120 and in between the source and drain contacts 110. Further, the second gate dielectric layer 118 is formed on surfaces 222, 214, 216, 218, and 220 of the enlarged void 212. In embodiments, the second gate dielectric layer 118 does not completely fill the enlarged void 212. The first and second gate dielectric layers 116 and 118 are formed to have a thickness sufficient for transistor operation. In an embodiment, the first and second gate dielectric layers 116 and 118 have a thickness between 2-4 nm. The first and second gate dielectric layers 116 and 118 electrically isolate the surfaces upon which they are formed from subsequently formed gate electrodes. The first and second gate dielectric layers 116 and 118 may be formed of any suitable high-k dielectric material. In an embodiment, the first and second gate dielectric layers 116 and 118 are formed from an insulating material such as, but not limited to, $SiO_2$, $HfO_2$, and $ZrO_2$.

In embodiments, any suitable conforming deposition process, such as CVD or ALD, may form the first and second gate dielectric layers 116 and 118. In an embodiment, the first and second gate dielectric layers 116 and 118 are formed simultaneously. In an embodiment, the second gate dielectric layer 118 is formed by ALD through the openings 211, which is discussed above in FIG. 2G-2. As such, the openings 211 should be designed to have a diameter that is wide enough to allow sufficient deposition material to flow into the enlarged void 212 to deposit the second gate dielectric layer 118. In an embodiment, the openings 211 have a diameter of at least 10 nm. In a particular embodiment, the openings 211 have a diameter in the range of 15-20 nm.

Figure 2J:
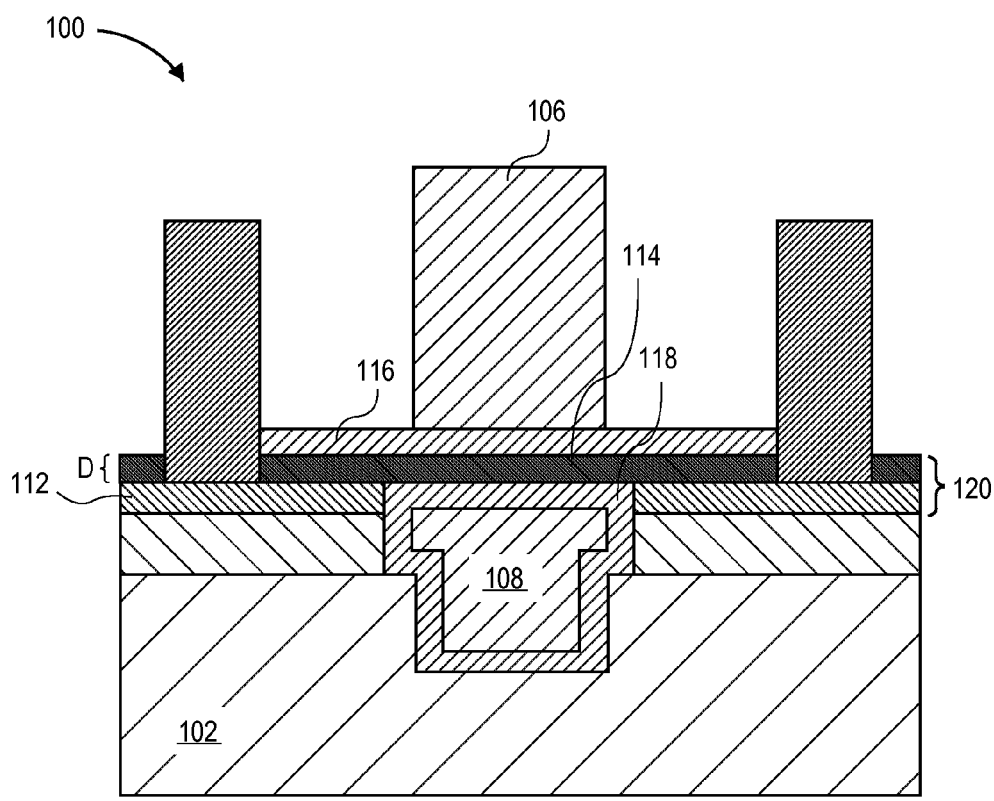
Figure 2K:
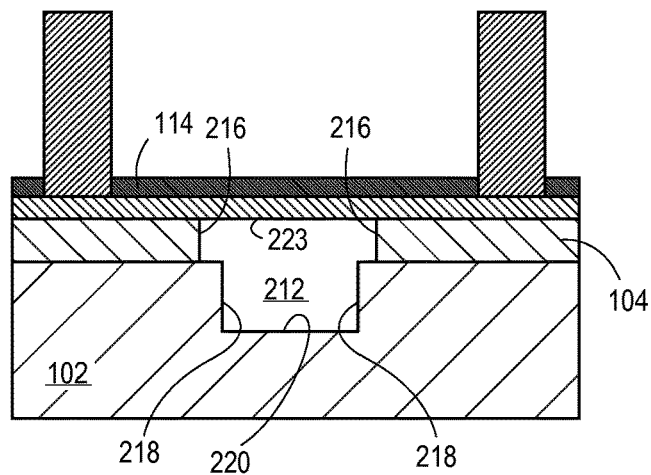
FIGS. 2K-2M illustrate cross-sectional views of a method of forming a depletion mode multi-gate HEMT as continued from FIG. 2G-1, in accordance with an embodiment of the invention.
Figure 2L:
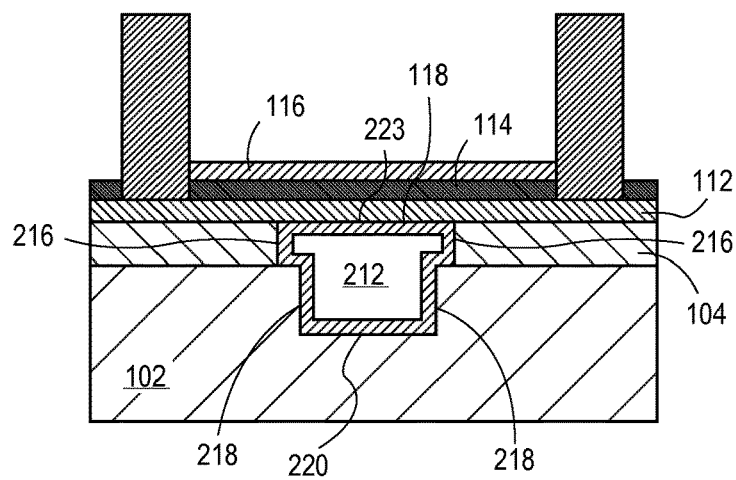
Figure 2M:
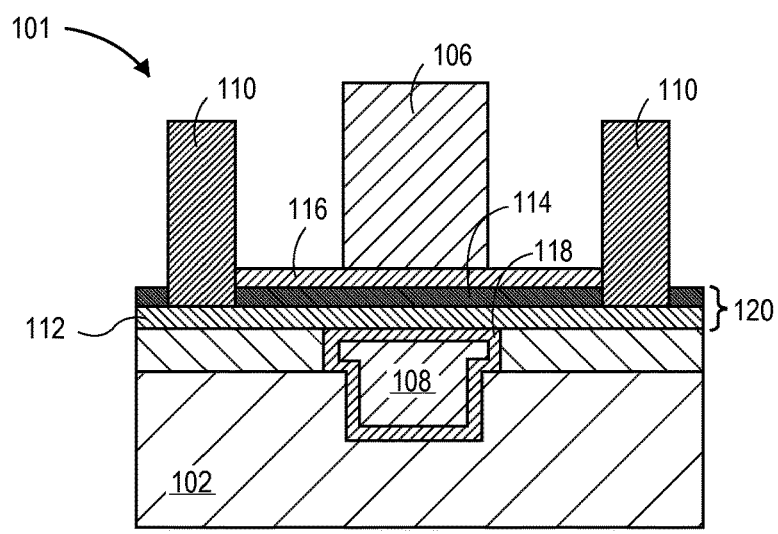

Thereafter, as depicted in FIG. 2J, a first gate electrode 106 and a second gate electrode 108 are formed, thereby completing the construction of the enhancement mode multi-gate HEMT 100 according to an embodiment of the invention. The first gate electrode 106 is formed on top of the first gate dielectric layer 116 and above the polar semiconductor layer 114. Additionally, the second gate electrode 108 is formed within the enlarged void 212 below the polar semiconductor layer 114. In an embodiment, the second gate electrode 108 completely fills the enlarged void 212. In an embodiment, the second gate electrode 108 is entirely enclosed within the second gate dielectric layer 118. The first and second gate electrodes 106 and 108 may be formed to have a gate length according to design requirements. In embodiments, the first and second gate electrodes may have a gate length depending on the depth D of the polar semiconductor layer 114. For example, if the depth D of the polar semiconductor layer 114 is around 20 nm, the first and second gate electrodes 106 and 108 may have the same gate length. In an embodiment, the first second gate electrodes 106 and 108 may have a gate length between 1 and 3 µm. In a particular embodiment, the first and second gate electrodes 106 and 108 have a gate length of 2 µm. In another example, if the depth D of the polar semiconductor layer 114 is around 100 nm, the first and second gate electrodes 106 and 108 may have different gate lengths. For instance, the second gate electrode 108 may have a wider gate length than the first gate electrode 106. In an embodiment, the first gate electrode 106 may have a gate length between 0.5 and 3 µm and the second gate electrode may have a gate length between 1 and 3 µm. In a particular embodiment, the first gate electrode 106 has a gate length of 1 m and the second gate electrode 108 has a gate length of 2 µm.

In an embodiment, the first gate electrode 106 and the second gate electrode 108 are vertically aligned to one another. Additionally, in an embodiment, the first gate electrode 106 and the second gate electrode 108 are electrically coupled to one another such that when voltage is applied to one gate, the other gate is also applied with the same voltage. As such, both sides of a channel layer 120 can be used to control current flow through the polar semiconductor layer 114. The first gate electrode 106 may be formed by any suitable gate formation process. For example, the first gate electrode 106 may be formed by a blanket deposition of a conductive material followed by an anisotropic etch of the deposited conductive material. In another example, the first electrode 106 may be formed by a replacement gate process or a damascene process. The second gate electrode 108 may be formed by any suitable deposition technique that can deposit material within a void embedded within a substrate. For example, the second gate electrode 108 may be formed by CVD, PVD, or ALD. In a particular embodiment, the first and second gate electrodes 106 and 108 are formed simultaneously. The first and second gate electrodes 106 and 108 may be formed by CVD, PVD, or ALD, followed by an anisotropic etch to form the first gate electrode 106. The first and second gate electrodes 106 and 108 may be formed of a conductive material, such as a metal. Exemplary metals include Ni, TiN, Pt, and W.

According to an embodiment of the invention, the enhancement mode multi-gate HEMT 100 illustrated in FIG. 2J has the polar semiconductor layer 114 disposed between the first and second gate electrodes 106 and 108. In this embodiment, the polarization layer 112 is not disposed between the first and second gate electrodes 106 and 108. Absence of the polarization layer 112 between the first and second gate electrodes 106 and 108 prevents formation of a 2DEG between the first and second gate electrodes 106 and 108. According to embodiments of the invention, applying the gate bias to the first and second gate electrodes 106 and 108 controls the channel layer 120 from above and below the polar semiconductor layer 114. As such, the enhancement mode multi-gate HEMT 100, according to an embodiment of the invention, has maximum control of the current that flows through the polar semiconductor layer 114.

In an alternative embodiment, the polarization layer 112 may be left intact between the first and second gate electrodes 106 and 108 to form a depletion mode multi-gate HEMT. The method of forming the depletion mode multi-gate HEMT is illustrated in FIGS. 2K-2M, which continues from FIG. 2G-1 described above.

In FIG. 2K, the void 210 from FIG. 2G-1 is expanded to form an enlarged void 212. In this embodiment, the enlarged void 212 does not expose the polar semiconductor layer 114. The enlarged void 212 may expose a bottom surface 223 of the polarization layer 112. In embodiments, the enlarged void 212 may further expose sidewalls 216 of the bonded adhesion layer 104, and surfaces 218 and 220 of the carrier substrate 102. The enlarged void 212 may be formed by a second etch process that substantially removes only the bonded adhesion layer 104, as discussed above with regard to FIG. 2H. Next, as shown in FIG. 2L, a first gate dielectric layer 116 and a second gate dielectric layer 118 are formed. In this embodiment, the first gate dielectric layer 116 is formed on top of the channel layer 120 and in between the source and drain contacts 110. Further, the second gate dielectric layer 118 is formed on the surfaces 223, 216, 218, and 220 of the enlarged void 212. The second gate dielectric layer 118 does not completely fill the enlarged void 212. In an embodiment, a portion of the second gate dielectric 118 is formed directly below the polarization layer 112. The first and second gate dielectric layers 116 and 118 have thicknesses, dimensions, and formation process techniques similar to those described above in FIG. 2I.

Thereafter, as depicted in FIG. 2M, a first gate electrode 106 and a second gate electrode 108 are formed, thereby completing the construction of the depletion mode multi-gate HEMT 101 according to an embodiment of the invention. In embodiments, the first gate electrode 106 is formed on top of the first gate dielectric layer 116 and above the channel layer 120. The second gate electrode 108 is formed within the enlarged void 212. The second gate electrode 108 may be disposed beneath the channel layer 120 formed of the polar semiconductor layer 114 and the polarization layer 112. In an embodiment, the second gate electrode 108 is entirely enclosed by the second gate dielectric layer 118. In an embodiment, the first gate electrode 106 and the second gate electrode 108 are vertically aligned to one another. Additionally, in an embodiment, the first gate electrode 106 and the second gate electrode 108 are electrically coupled to one another such that when voltage is applied to one gate, the other gate is also applied with the same voltage. As such, both sides of the channel layer 120 can be used to control current flow through the channel layer 120. In an embodiment, the first and second gate electrodes 106 and 108 are formed by the process techniques and according to the structural dimensions disclosed above in FIG. 2J.

According to an embodiment of the invention, the depletion mode multi-gate HEMT 101 has both the polar semiconductor layer 114 and the polarization layer 112 disposed between the first and second gate electrodes 106 and 108. The depletion mode multi-gate HEMT 101 therefore has a 2DEG between the first and second gate electrodes 106 and 108. In an embodiment, the 2DEG is 1-2 nm away from the interface within the polar semiconductor layer 114. According to embodiments of the invention, applying the gate bias to the first and second gate electrodes 106 and 108 controls the channel layer 120 from above and below the polar semiconductor layer 114. As such, the depletion mode multi-gate HEMT 101, according to an embodiment of the invention, has maximum control of the current that flows through the channel layer 120.

Figure 3:
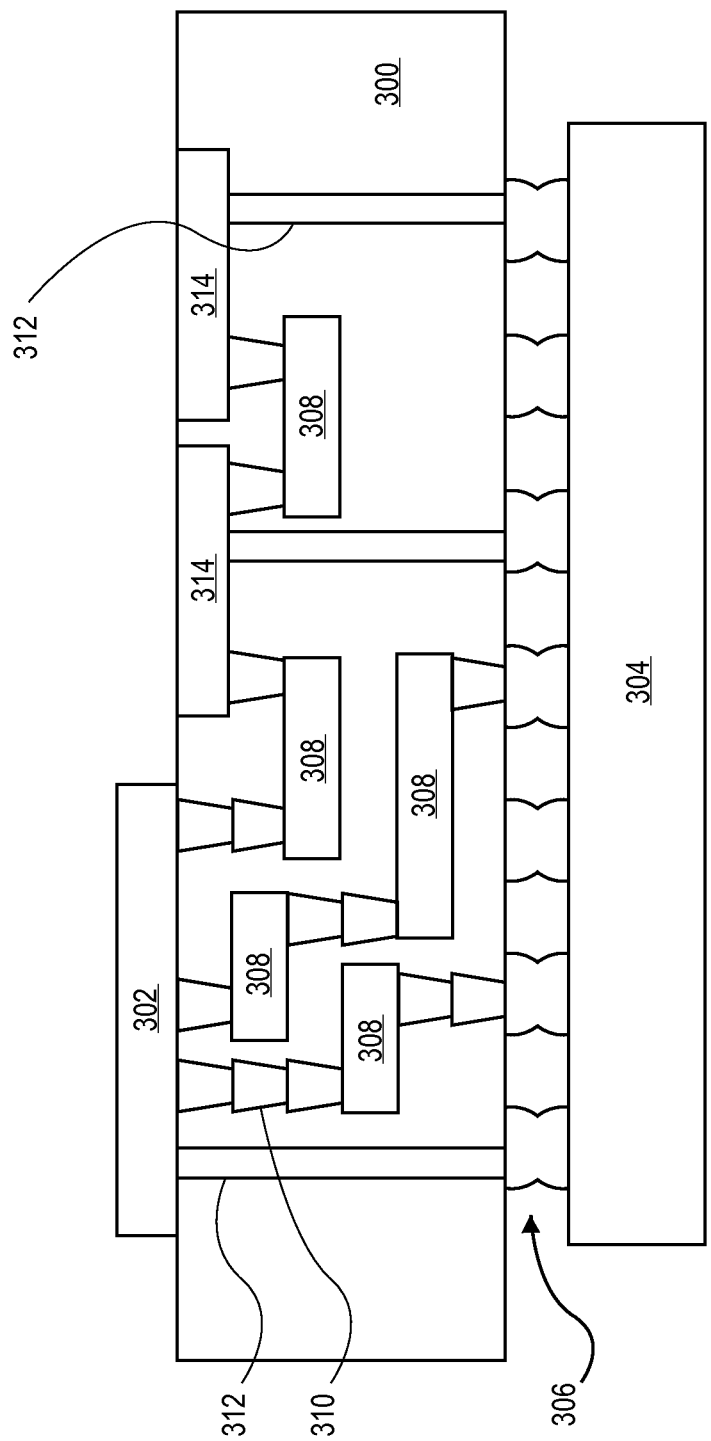
FIG. 3 illustrates an interposer implementing one or more embodiments of the invention.

FIG. 3 illustrates an interposer 300 that includes one or more dies fabricated with embodiments of the invention. The interposer 300 is an intervening substrate used to bridge a first substrate 302 to a second substrate 304. The first substrate 302 may be, for instance, an integrated circuit die. The second substrate 304 may be, for instance, a memory module, a computer motherboard, or another integrated circuit die. Generally, the purpose of an interposer 300 is to spread a connection to a wider pitch or to reroute a connection to a different connection. For example, an interposer 300 may couple an integrated circuit die to a ball grid array (BGA) 306 that can subsequently be coupled to the second substrate 304. In some embodiments, the first and second substrates 302/304 are attached to opposing sides of the interposer 300. In other embodiments, the first and second substrates 302/304 are attached to the same side of the interposer 300. And in further embodiments, three or more substrates are interconnected by way of the interposer 300.

The interposer 300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 308 and vias 310, including but not limited to through-silicon vias (TSVs) 312. The interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 300.

In accordance with embodiments of the invention, multi-gate HEMTs or methods of forming the multi-gate HEMTs disclosed herein may be used in the fabrication of interposer 300.

Figure 4:
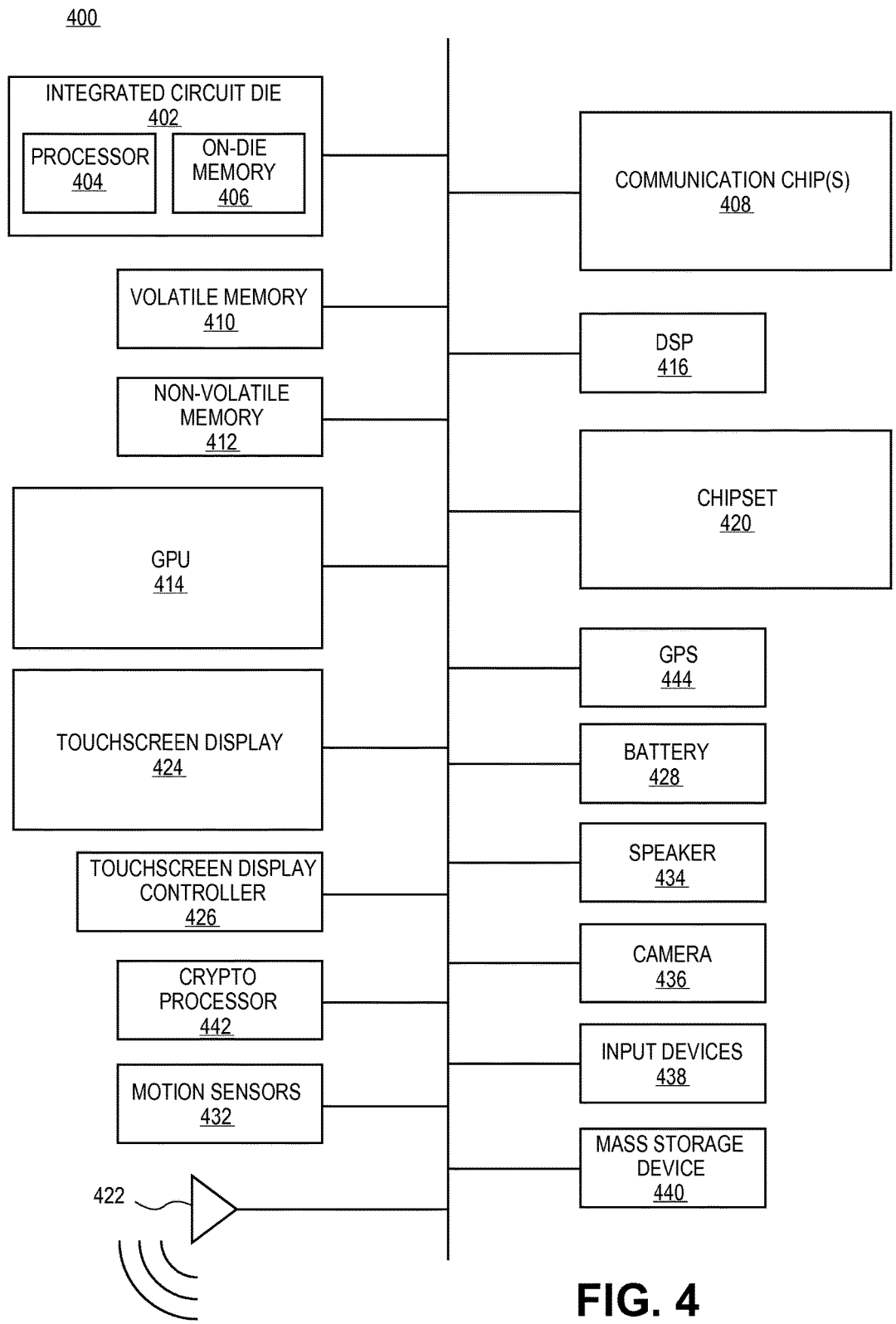
FIG. 4 illustrates a computing device built in accordance with an embodiment of the invention.

FIG. 4 illustrates a computing device 400 in accordance with one embodiment of the invention. The computing device 400 may include a number of components. In one embodiment, these components are attached to one or more motherboards. In an alternate embodiment, these components are fabricated onto a single system-on-a-chip (SoC) die rather than a motherboard. The components in the computing device 400 include, but are not limited to, an integrated circuit die 402 and at least one communication chip 408. In some implementations the communication chip 408 is fabricated as part of the integrated circuit die 402. The integrated circuit die 402 may include a CPU 404 as well as on-die memory 406, often used as cache memory, that can be provided by technologies such as embedded DRAM (eDRAM) or spin-transfer torque memory (STTM or STTM-RAM).

Computing device 400 may include other components that may or may not be physically and electrically coupled to the motherboard or fabricated within an SoC die. These other components include, but are not limited to, volatile memory 410 (e.g., DRAM), non-volatile memory 412 (e.g., ROM or flash memory), a graphics processing unit 414 (GPU), a digital signal processor 416, a crypto processor 442 (a specialized processor that executes cryptographic algorithms within hardware), a chipset 420, an antenna 422, a display or a touchscreen display 424, a touchscreen controller 426, a battery 428 or other power source, a power amplifier (not shown), a global positioning system (GPS) device 428, a compass 430, a motion coprocessor or sensors 432 (that may include an accelerometer, a gyroscope, and a compass), a speaker 434, a camera 436, user input devices 438 (such as a keyboard, mouse, stylus, and touchpad), and a mass storage device 440 (such as hard disk drive, compact disk (CD), digital versatile disk (DVD), and so forth).

The communications chip 408 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 408. For instance, a first communication chip 408 may be dedicated to shorter range wireless communications such as Wi-Fi and Bluetooth and a second communication chip 408 may be dedicated to longer range wireless communications such as GPS, EDGE, GPRS, CDMA, WiMAX, LTE, Ev-DO, and others.

The processor 404 of the computing device 400 may include one or more multi-gate HEMT devices of embodiments of the present invention and which may be formed in accordance with embodiments of the invention. The term "processor" may refer to any device or portion of a device that processes electronic data from registers and/or memory to transform that electronic data into other electronic data that may be stored in registers and/or memory.

The communication chip 408 may also include one or more multi-gate HEMT devices of embodiments of the present invention and which may be formed in accordance with embodiments of the invention.

In further embodiments, another component housed within the computing device 400 may contain one or more multi-gate HEMT devices of embodiments of the present invention and which may be formed in accordance with embodiments of the invention.

In various embodiments, the computing device 400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

In an embodiment, a semiconductor device includes a substrate, and adhesion layer on top of the substrate, a channel layer on top of the adhesion layer, a first gate electrode on top of the channel layer, the first gate electrode having a first gate dielectric layer in between the first gate electrode and the channel layer, a second gate electrode beneath the channel layer, the second gate electrode having a second gate dielectric layer completely surrounding the second gate electrode, and a pair of source and drain contacts on opposite sides of the first electrode.

In an embodiment, the channel layer is a heterogeneous structure. The channel layer may include a polarization layer and a polar semiconductor layer directly on top of the polarization layer. The polarization layer may be formed of AlGaN and the polar semiconductor layer may be formed of GaN. In an embodiment, the polarization layer is not disposed between the first and second gate electrodes. In an embodiment, the polar semiconductor layer and the polarization layer are disposed between the first and second gate electrodes. In an embodiment, the polarization layer induces a two-dimensional electron gas (2DEG) at the interface between the polarization layer and the polar semiconductor layer. The 2DEG may be 1-2 nm away from the interface within the polar semiconductor layer. In an embodiment, the pair of source and drain contacts are formed on the polarization layer through the polar semiconductor layer. In an embodiment, the first gate dielectric layer is formed between the pair of source and drain contacts. The second gate electrode may extend into a trench of the carrier substrate. In an embodiment, the first gate electrode is vertically aligned to the second gate electrode.

In an embodiment, a method of forming a semiconductor device includes providing a donor substrate and a receiver substrate, the receiver substrate having an embedded sacrificial layer, transferring a portion of the donor substrate onto the receiver substrate to form a device substrate, a top portion of the device substrate forms a channel layer, forming a pair of source and drain regions on the channel layer and on opposite sides of the embedded sacrificial layer, removing the embedded sacrificial layer to form a void beneath the channel layer, forming a first gate dielectric layer on top of a portion of the channel layer and a second gate dielectric layer on sidewalls within the void; and forming a first gate electrode on the first gate dielectric layer above the channel layer and a second gate electrode on the second gate electrode beneath the channel layer within the void.

In an embodiment, forming the void includes first and second selective etch processes. The first selective etch process may substantially remove only the sacrificial layer. The second selective etch process may substantially remove only the adhesion layer. In an embodiment, the second selective etch process further includes a third selective etch process. The third selective etch process may substantially remove a portion of the bottom layer. In an embodiment, forming the void exposes the bottom layer within the gate void. Forming the void may expose the top layer within the void. In an embodiment, selectively removing the sacrificial layer includes etching openings into the device substrate to expose the sacrificial layer and removing the sacrificial layer with a selective etchant applied through the openings. The selective etchant may selectively remove the sacrificial layer relative to surrounding materials. In an embodiment, transferring a portion of the donor substrate onto the receiver substrate includes attaching the donor substrate to the receiver substrate, bonding the donor substrate to the receiver substrate to form a bonded substrate, and separating the bonded substrate to form the device substrate. The device substrate may include the receiver substrate and a portion of the donor substrate on top of the receiver substrate. In an embodiment, transferring a portion of the donor substrate onto the receiver substrate further includes performing fusion bonding to adhere the donor substrate to the receiver substrate.

In an embodiment, a computing device includes a motherboard, a processor mounted on the motherboard, and a communication chip fabricated on the same chip as the processor or mounted on the motherboard. The processor includes a substrate, an adhesion layer on top of the substrate, a channel layer on top of the adhesion layer, a first gate electrode on top of the channel layer, the first gate electrode having a first gate dielectric layer in between the first gate electrode and the channel layer, a second gate electrode embedded within the substrate and beneath the channel layer, the second gate electrode having a second gate dielectric layer completely surrounding the second gate electrode, and a pair of source and drain contacts on opposite sides of the first gate electrode.

In an embodiment, the channel layer is a heterogeneous structure. In an embodiment, the channel layer includes a polarization layer and a polar semiconductor layer directly on top of the polarization layer. The polarization layer may induce a two-dimensional electron gas (2DEG) at the interface between the polarization layer and the polar semiconductor layer. The polarization layer may be formed of AlGaN and the polar semiconductor layer may be formed of GaN. In an embodiment, the first gate electrode is vertically aligned to the second gate electrode.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A semiconductor device, comprising:
   a substrate;
   an adhesion layer on top of the substrate;
   a channel layer on top of the adhesion layer;
   a first gate electrode on top of the channel layer, and a first gate dielectric layer in between the first gate electrode and the channel layer;
   a second gate electrode beneath the channel layer, and a second gate dielectric layer completely surrounding the second gate electrode, wherein the second gate electrode is laterally adjacent to the adhesion layer and extends into the substrate at a location vertically beneath the first gate electrode; and
   a pair of source and drain contacts on opposite sides of the first gate electrode.

2. The semiconductor device of claim 1, wherein the channel layer is a heterogeneous structure.

3. The semiconductor device of claim 2, wherein the channel layer comprises a polarization layer and a polar semiconductor layer directly on top of the polarization layer.

4. The semiconductor device of claim 3, wherein the polarization layer is formed of AlGaN and the polar semiconductor layer is formed of GaN.

5. The semiconductor device of claim 3, wherein the polarization layer is not disposed between the first and second gate electrodes.

6. The semiconductor device of claim 3, wherein the polar semiconductor layer and the polarization layer are disposed between the first and second gate electrodes.

7. The semiconductor device of claim 6, wherein the polarization layer induces a two-dimensional electron gas (2DEG) at an interface between the polarization layer and the polar semiconductor layer.

8. The semiconductor device of claim 7, wherein the 2DEG is 1-2 nm away from the interface within the polar semiconductor layer.

9. The semiconductor device of claim 1, wherein the second gate electrode extends into a trench of the substrate.

10. The semiconductor device of claim 1, wherein the first gate electrode is vertically aligned to the second gate electrode.

11. A computing device, comprising:
    a motherboard;
    a processor mounted on the motherboard; and
    a communication chip fabricated on the same chip as the processor or mounted on the motherboard;
    wherein the processor comprises:
      a substrate;
      an adhesion layer on top of the substrate;
      a channel layer on top of the adhesion layer;
      a first gate electrode on top of the channel layer, and a first gate dielectric layer in between the first gate electrode and the channel layer;
      a second gate electrode embedded within the substrate and beneath the channel layer, and a second gate dielectric layer completely surrounding the second gate electrode, wherein the second gate electrode is laterally adjacent to the adhesion layer and extends into the substrate at a location vertically beneath the first gate electrode; and
      a pair of source and drain contacts on opposite sides of the first gate electrode.

12. The computing device of claim 11, wherein the channel layer is a heterogeneous structure.

13. The computing device of claim 12, wherein the channel layer comprises a polarization layer and a polar semiconductor layer directly on top of the polarization layer.

14. The computing device of claim 13, wherein the polarization layer induces a two-dimensional electron gas (2DEG) at an interface between the polarization layer and the polar semiconductor layer.

15. The computing device of claim 14, wherein the polarization layer is formed of AlGaN and the polar semiconductor layer is formed of GaN.

* * * * *